United States Patent
Kuo et al.

(10) Patent No.: US 7,205,644 B2
(45) Date of Patent: *Apr. 17, 2007

(54) MEMORY CARD STRUCTURE AND MANUFACTURING METHOD THEREOF

(75) Inventors: Cheng-Hsien Kuo, Taipei Hsien (TW); Ming-Jhy Jiang, Taipei (TW); Cheng-Kang Yu, Taipei County (TW); Hui-Chuan Chuang, Tainan County (TW)

(73) Assignee: Advanced Flash Memory Card Technology Co., Ltd., Taipei Hsieng (TW)

( * ) Notice: Subject to any disclaimer, the term of this patent is extended or adjusted under 35 U.S.C. 154(b) by 146 days.

This patent is subject to a terminal disclaimer.

(21) Appl. No.: 10/904,975

(22) Filed: Dec. 8, 2004

(65) Prior Publication Data

US 2006/0077749 A1    Apr. 13, 2006

(30) Foreign Application Priority Data

Oct. 7, 2004   (TW) ............................. 93130326 A

(51) Int. Cl.
*H01L 23/02* (2006.01)
*H01L 23/28* (2006.01)

(52) U.S. Cl. ...................... 257/685; 257/686; 257/777; 257/787; 257/789; 257/E25.006; 257/E25.013; 257/E25.018; 438/106; 438/112; 438/124; 438/126; 438/127; 438/FOR. 384

(58) Field of Classification Search ................ None
See application file for complete search history.

(56) References Cited

U.S. PATENT DOCUMENTS 5,811,877 A * 9/1998 Miyano et al. ............. 257/706
6,777,797 B2 * 8/2004 Egawa ....................... 257/686

* cited by examiner

*Primary Examiner*—Jasmine Clark
(74) *Attorney, Agent, or Firm*—Jiang Chyun IP Office

(57) ABSTRACT

A memory card structure comprising a substrate, a plurality of memory chips, some package material and an ultra-thin plastic shell is provided. To fabricate the memory card, a substrate having a first surface and a second surface is provided. The first surface has a plurality of outer contacts and the second surface has at least a cavity. There is a plurality of inner contacts around the cavity. Furthermore, the outer contacts and the inner contacts are electrically connected to each other. The memory chips are stacked up inside the cavity and electrically connected to the inner contacts of the substrate. Then, the memory chips and the inner contacts are encapsulated using the molding compound. Thereafter, the ultra-thin plastic shell is placed over the second surface and attached to the substrate. That portion of the ultra-thin plastic shell covering the memory chips has a thickness of about 0.1~0.15 mm.

16 Claims, 5 Drawing Sheets

MEMORY CARD STRUCTURE AND MANUFACTURING METHOD THEREOF

CROSS-REFERENCE TO RELATED APPLICATION

This application claims the priority benefit of Taiwan application serial no. 93130326, filed Oct. 7, 2004.

BACKGROUND OF THE INVENTION

1. Field of the Invention

The present invention relates to a memory device and manufacturing method thereof. More particularly, the present invention relates to a memory card structure and manufacturing method thereof.

2. Description of the Related Art

With the rapid advance in integrated circuit fabrication technologies and the many breakthroughs in material engineering in recent years, the size of a chip continues to decrease despite the inclusion of more functions. Many electronic products such as electronic thesauruses, digital cameras and countless other types of digital products routinely deploy at least one integrated circuit chip. As the techniques for fabricating chip packages mature, it is now possible to enclose a single or a multiple of chips inside a thin card so that a large quantity of digital data can be stored in one place. Utilizing the large storage capacity of a data card, a portable memory device that occupies a considerably smaller volume than a conventional magnetic recording medium is produced. In general, this type of electronic storage medium is called a memory card.

FIG. 1 is a schematic cross-sectional view showing the structure of a conventional memory card. As shown in FIG. 1, the memory card 100 comprises a substrate 110, a memory chip 120, some molding compound 130 and a plastic shell 140. The substrate 110 has a first surface 112 and a second surface 114. The first surface 112 has a plurality of outer contacts 116 while the second surface 114 has a plurality of inner contacts 118. The outer contacts 116 and the inner contacts 118 are electrically connected to each other. The memory chip 120 is electrically connected to the inner contacts 118. The molding compound 130 encapsulates the memory chip 120 and the inner contacts 118. The plastic shell 140 is attached to the second surface 114 of the substrate 110 through some thermal plastic glue 142.

However, there is an increase demand for smaller memory units having a larger data storage capacity in recent years. Since the data storage capacity of the conventional memory card can no longer satisfy these demands, there is an urgent need to boost the storage capacity of memory cards.

SUMMARY OF THE INVENTION

Accordingly, at least one objective of the present invention is to provide a memory card structure with a larger data storage capacity.

At least a second objective of the present invention is to provide a method of fabricating a memory card having the aforementioned memory card structure.

To achieve these and other advantages and in accordance with the purpose of the invention, as embodied and broadly described herein, the invention provides a memory card structure. The memory card comprises a substrate, a plurality of memory chips, some molding compound and an ultra-thin plastic shell. The substrate has a first surface and a second surface. The first surface has a plurality of outer contacts and the second surface has at least a cavity. A plurality of inner contacts is disposed around the cavity. The outer contacts and the inner contacts are electrically connected to each other. The memory chips are stacked up inside the cavity. The memory cards are electrically connected to the inner contacts of the substrate. The memory chips and the inner contacts are encapsulated by the molding compound. The ultra-thin plastic shell is placed on the second surface of the substrate. That portion of the ultra-thin plastic shell covering the memory chips has a thickness of about 0.1~0.15 mm.

According to the memory card structure of the present invention, the body of the ultra-thin plastic shell has a shape that meets the specifications of a smart media card. Furthermore, the memory chip is electrically connected to the inner contacts through a plurality of conductive wires. These conductive wires comprise gold wires or aluminum wires, for example. Moreover, the memory chips are grouped in pairs and stacked inside the cavity. The memory chips in each pair are separated from each other through the molding compound.

According to the memory card structure of the present invention, the molding compound comprises epoxy resin or polyimide. In addition, the ultra-thin plastic shell is fabricated using a material selected from a group comprising polycarbonate, polystyrene, acrylonitril butadiene styrene (ABS) resin and other suitable generic engineering plastics.

The present invention also provides a method of fabricating a memory card. First, a substrate having a first surface and a second surface is provided. The first surface has a plurality of outer contacts and the second surface has at least a cavity. A plurality of inner contacts surrounds the cavity. The outer contacts and the inner contacts are electrically connected to each other. Thereafter, a plurality of memory chips is stacked inside the cavity and electrically connected to corresponding inner contacts. A molding process is carried out to encapsulate the memory chips and the inner contacts with a molding compound. Then, an ultra-thin plastic shell is placed over the second surface and attached to the substrate. The ultra-thin plastic shell has a thickness of about 0.1~0.15 mm in areas over the memory chips.

According to the aforementioned method of fabricating the memory card, the memory card formed after joining the ultra-thin plastic shell and the substrate together has a body that meets the specification of a Smart Media Card. In addition, the method of connecting the memory chips to the inner contacts includes wire bonding.

According to the aforementioned method of fabricating the memory card, the memory chips are stacked inside the cavity in pairs. The stacking method includes disposing one of the memory chips inside the cavity and connecting the memory chip with some of the inner contacts. Thereafter, a first stage molding process is carried out to encapsulate the memory chip and corresponding inner contacts with a molding compound. After that, a second memory chip is disposed over the molding compound and then electrically connected to some of the inner contacts. Finally, a second stage molding process is carried out to encapsulate the second memory chip and corresponding inner contacts.

According to the aforementioned method of fabricating the memory card, the memory chips are electrically connected to the inner contacts by wire bonding. Furthermore, the method of encapsulating the chips and the inner contacts includes performing a dispensing process. In addition, the ultra-thin plastic shell is formed in a mold injection process with the following steps. First, a mold and a vacuum pump are provided. The mold has an inner cavity linked to the vacuum pump. Thereafter, molding compound is injected into the mold cavity through an injection mechanism while the vacuum pump sucks out the gases inside the mold cavity.

The memory card of the present invention comprises a substrate having a cavity therein and an ultra-thin plastic shell so that a stack of memory chips can be hidden inside the cavity to increase the memory storage capacity of the memory card. Furthermore, the process of fabricating the ultra-thin plastic card includes sucking air from the mold cavity with a vacuum pump. Therefore, a very thin plastic shell can be produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
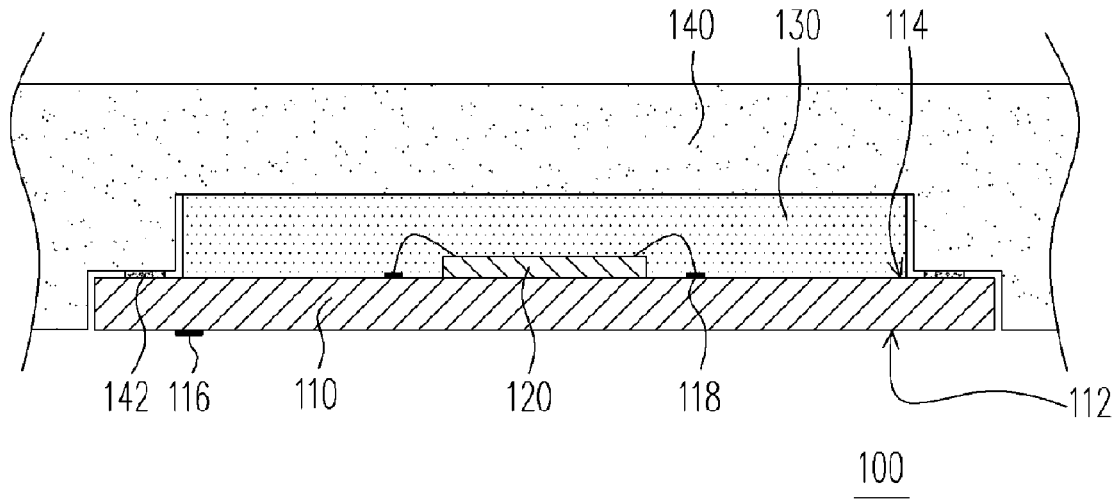
FIG. 1 is a schematic cross-sectional view showing the structure of a conventional memory card.

Reference will now be made in detail to the present preferred embodiments of the invention, examples of which are illustrated in the accompanying drawings. Wherever possible, the same reference numbers are used in the drawings and the description to refer to the same or like parts.

Figure 2:
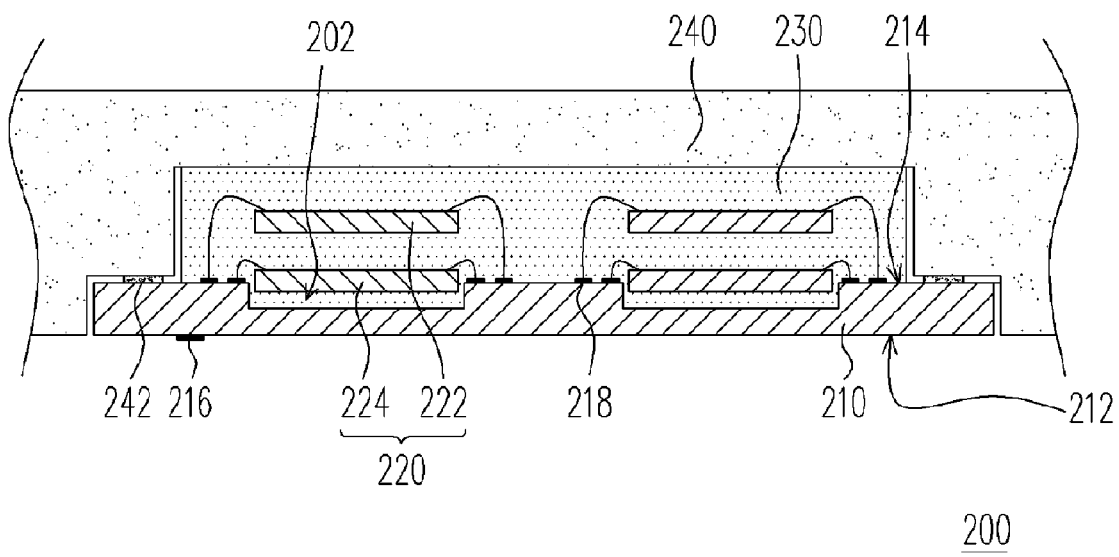
FIG. 2 is a schematic cross-sectional view showing the structure of a memory card according to one embodiment of the present invention.

FIG. 2 is a schematic cross-sectional view showing the structure of a memory card according to one embodiment of the present invention. As shown in FIG. 2, the memory card 200 comprises a substrate 210, a plurality of memory chips 220, some molding compound 230 and an ultra-thin plastic shell 240. The substrate 210 has a first surface 212 and a second surface 214. The first surface 212 has a plurality of outer contacts 216 and the second surface 214 has at least a cavity 202. A plurality of inner contacts 218 is formed around the cavity 202. The outer contacts 216 and the inner contacts 218 are electrically connected to each other. The memory chips 220 are stacked inside the cavity 202. In the present embodiment, the memory chips 220 are stacked in pairs inside the cavity 202. The memory chips 220 are electrically connected to their corresponding inner contacts 218.

The molding compound 230 encapsulates the memory chips 220 and the inner contacts 218. The ultra-thin plastic shell 240 covers the second surface 214 and has a thickness of about 0.1~0.15 mm in areas over the memory chips 220.

Figure 3A:
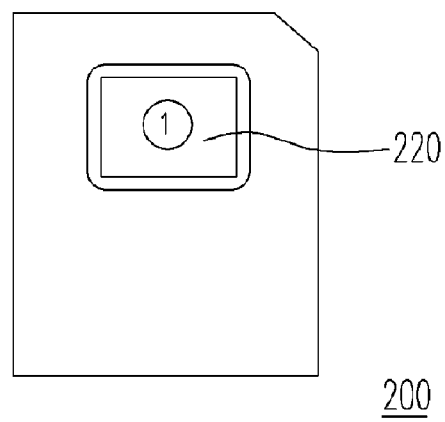
FIGS. 3A through 3C are top views showing three different types of dispositions of the memory chips inside a memory card.
Figure 3B:
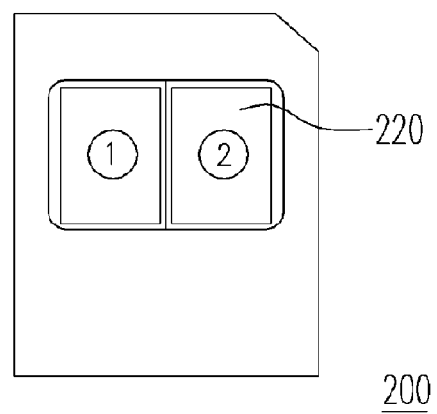
Figure 3C:
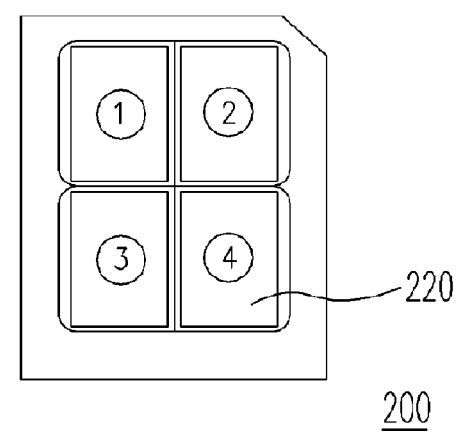

FIGS. 3A through 3C are top views showing three different types of dispositions of the memory chips inside a memory card. One set of the memory chips 220 can be disposed within the memory card 200 as shown in FIG. 3A. Alternatively, two sets of memory chips 220 can be disposed side by side within the memory card as shown in FIG. 3B or four sets of memory chips 220 are disposed as an array within the memory card as shown in FIG. 3C.

Figure 4A:
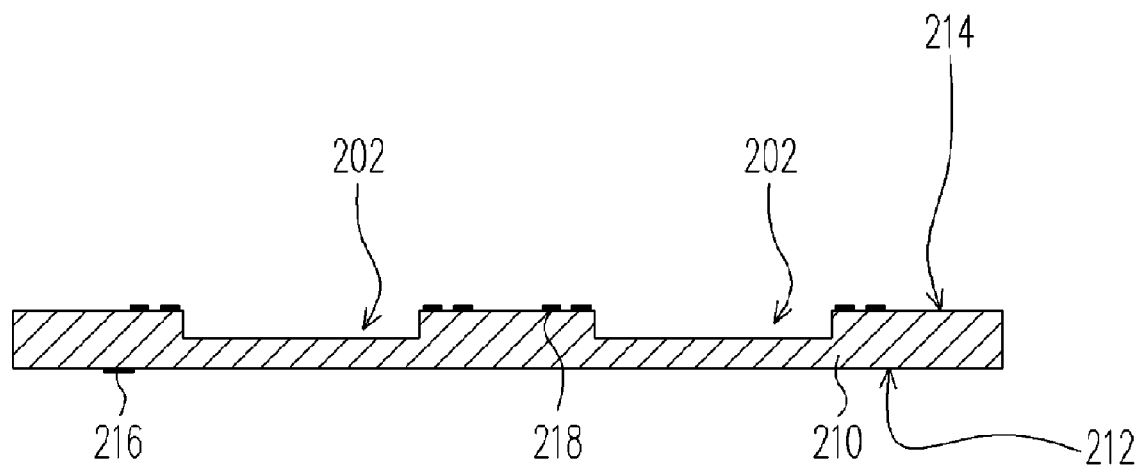
FIGS. 4A through 4D are schematic cross-sectional views showing the steps for fabricating a memory card according to one embodiment of the present invention.

FIGS. 4A through 4D are schematic cross-sectional views showing the steps for fabricating a memory card according to one embodiment of the present invention. As shown in FIG. 4A, a substrate 210 having a first surface 212 and a second surface 214 is provided. The first surface 212 has a plurality of outer contacts 216 for exchanging data with the outside world. The second surface 214 has at least a cavity 202. A plurality of inner contacts 218 is disposed around the cavity 202. The outer contacts 216 and the inner contacts 218 are electrically connected to each other through a series of patterned circuits (not shown) and blind vias (not shown).

Figure 4B:
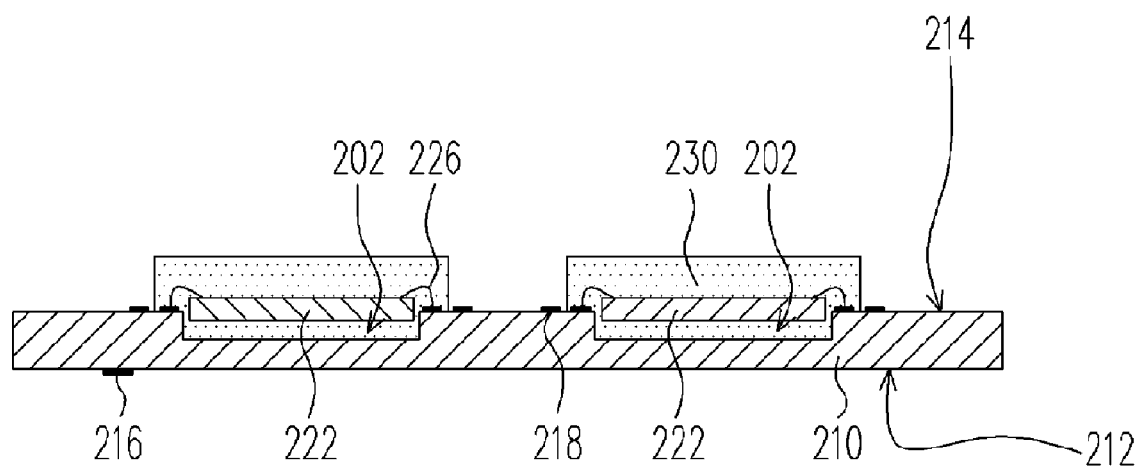

As shown in FIG. 4B, a first set of memory chips 222 is disposed inside the cavity 202. The memory chips 222 are electrically connected to a portion of the inner contacts 218 by wire bonding with conductive wires 226. The conductive wires are fabricated using a conductive material having low electrical resistance such as gold wires or aluminum wires. Thereafter, a dispensing method or other packaging method is used to encapsulate the memory chips 222 and corresponding inner contacts 218 with a molding compound 230 such as epoxy resin or polyimide.

Figure 4C:
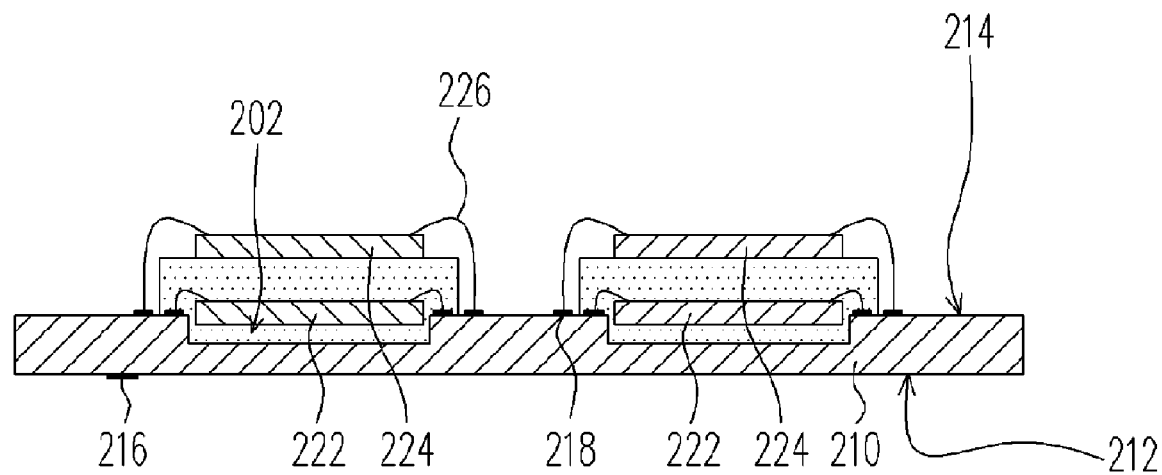
Figure 4D:
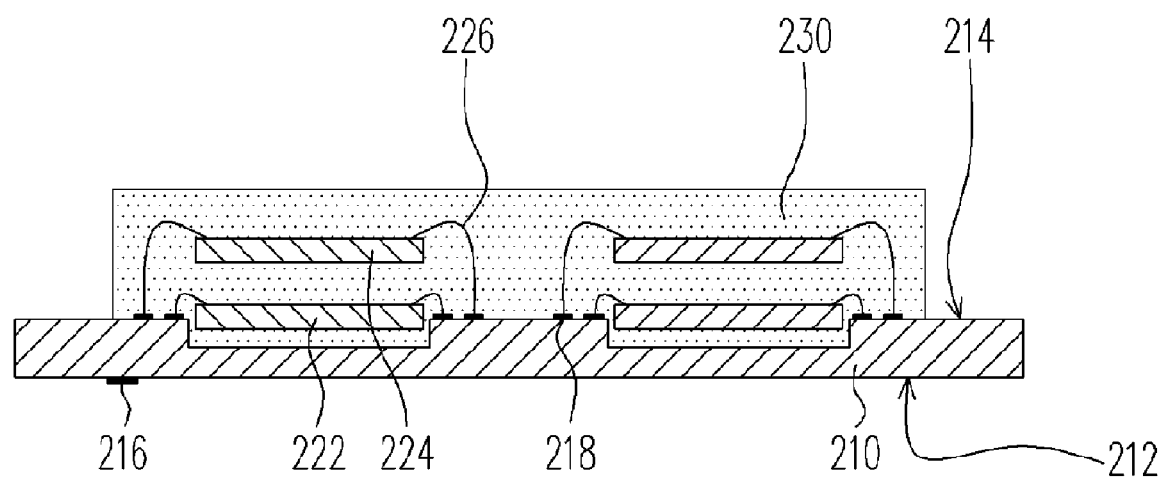

As shown in FIG. 4C, a second set of memory chips 224 is disposed over the molding compound 230. The second memory chips 224 are electrically connected to another portion of the inner contacts 218 by wire bonding with conductive wires 226.

Thereafter, a dispensing method or other packaging method is used to encapsulate the memory chips 224 and corresponding inner contacts 218 with a molding compound 230.

A thermal plastic glue 242 is used to adhere the ultra-thin plastic shell 240 to the second surface 214 of the substrate 212 as shown in FIG. 2 to protect the inner components of the memory card 200. One major aspect of the ultra-thin plastic shell 240 is that the thickness in areas over the memory chips 224 is about 0.1~0.15 mm. The ultra-thin plastic shell is fabricated from material including, for example, polycarbonate, polystyrene or acrylonitril butadiene styrene (ABS) resin.

In the end, the memory card has a body that meets the specifications of a smart media card. However, the body or the memory card 200 in the present invention may be fabricated to meet the specifications of other memory devices including, for example, Compact Flash memory Card (CF Card), Memory Stick Card (MS Card), Memory Stick Duo card (MS Duo Card), xD picture card(xD Card), Multi Media Card (MMC), Reduced Size Multi Media Card (RS MMC), Secure Digital Card(SD Card), Mini Secure Digital card (Mini SD card), µ card, reduced size µ card and other mini memory cards with analogous functions.

Figure 5:
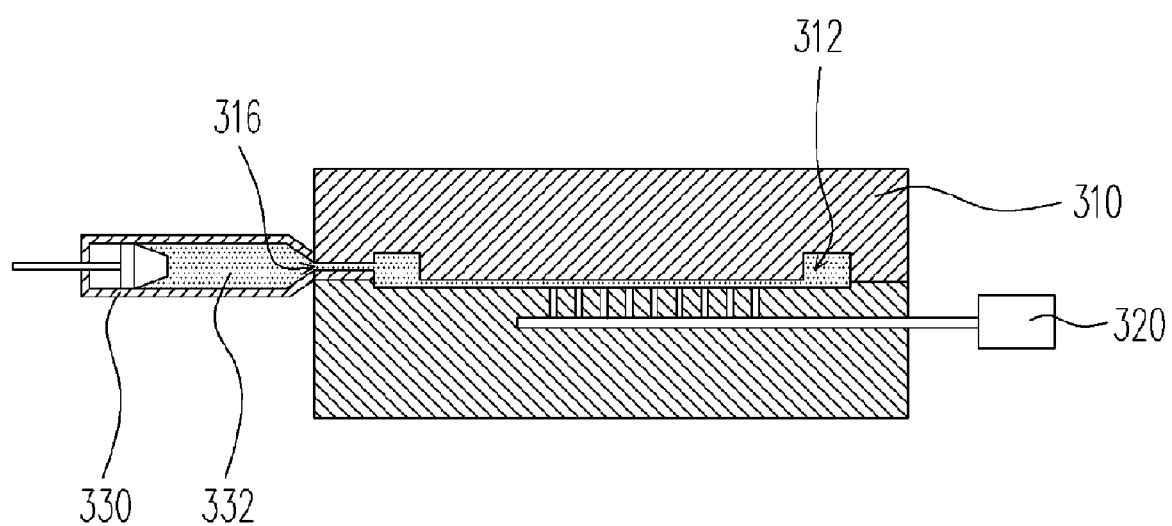
FIG. 5 is a schematic cross-sectional view showing the equipment for fabricating an ultra-thin plastic shell.

To fabricate the ultra-thin plastic shell 240, special equipment and method are used. FIG. 5 is a schematic cross-sectional view showing the equipment for fabricating an ultra-thin plastic shell. As shown in FIG. 5, the mold 310 has an internal cavity 312 having a shape that follows the outline the body of the ultra-thin plastic shell 240. In the process of fabricating the ultra-thin plastic shell 240, molding compound 322 is injected through a hole 316 into the mold cavity 312 using a mold injecting mechanism. Furthermore, a vacuum pump 320 connected to the mold cavity 312 continuously sucks air from the cavity 312 to reduce the pressure. Since the mold cavity 312 is maintained at a low pressure, the molding compound 332 can fill the entire cavity 312 uniformly. Ultimately, the ultra-thin plastic shell 240 has a thin body and a homogeneous makeup.

It should be noted that the memory chips are stacked up in pairs in the present embodiment. However, the present invention sets no particular preconditions for the stacking arrangement of the memory chips. In other words, the memory chips may be stacked alternately over each other or, under some circumstances, just one memory chip or a plurality of memory chips (more than two memory chips) may be stacked on top of each other.

In summary, the memory card of the present invention comprises a substrate having a cavity therein and an ultra-thin plastic shell so that a stack of memory chips can be hidden inside the cavity to increase the memory storage capacity of the memory card. In addition, the process of fabricating the ultra-thin plastic card includes sucking air from the mold cavity with a vacuum pump. Therefore, a very thin plastic shell can be produced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory card structure, comprising:
   a substrate having a first surface and a second surface, wherein the first surface has a plurality of outer contacts and the second surface has at least a cavity with a plurality of inner contacts disposed around it, and the outer contacts and the inner contacts are electrically connected to each other;
   a plurality of memory chips disposed inside the cavity, wherein the memory chips are electrically connected to the inner contacts;
   some molding compound encapsulating the memory chips and the inner contacts; and
   an ultra-thin plastic shell covering the second surface, wherein the area of the ultra-thin plastic shell over the memory chips has a thickness between about 0.1~0.15 mm.

2. The memory card structure of claim 1, wherein the ultra-thin plastic shell has a body that meets the specification of a smart media card.

3. The memory card structure of claim 1, wherein the memory chips are connected to the inner contacts through a plurality of conductive wires.

4. The memory card structure of claim 3, wherein the conductive wires comprise gold or aluminum wires.

5. The memory card structure of claim 1, wherein the memory chips are grouped and stacked over each other in pairs inside the cavity.

6. The memory card structure of claim 5, wherein each pair of memory chips is separated from each other through the molding compound.

7. The memory card structure of claim 1, wherein the material constituting the molding compound is selected from a group consisting of epoxy resin and polyimide.

8. The memory card structure of claim 1, wherein the material constituting the ultra-thin plastic shell is selected from a group consisting of polycarbonate, polystyrene and acrylonitril butadiene styrene (ABS) resin.

9. A method of fabricating a memory card, comprising the steps of:
   providing a substrate having a first surface and a second surface, wherein the first surface has a plurality of outer contacts and the second surface has at least a cavity with a plurality of inner contacts around it, and the outer contacts and the inner contacts are electrically connected to each other;
   stacking a plurality of memory chips inside the cavity, electrically connecting each memory chip to corresponding inner contacts and performing a molding process to encapsulate the memory chips and the inner contacts using a molding compound; and
   providing an ultra-thin plastic shell to cover the second surface and adhere to the substrate, wherein the ultra-thin plastic shell has a thickness of between about 0.1~0.15 mm in areas over the memory chips.

10. The method of claim 9, wherein the memory card has a body that meets the specification of the smart memory card after joining the ultra-thin plastic shell and the substrate together.

11. The method of claim 9, wherein the step of connecting the memory chips to the inner contacts comprises wire bonding.

12. The method of claim 9, wherein the step of stacking memory chips inside the cavity comprises dividing the memory chips into pairs and stacking one chip over the other inside the cavity.

13. The method of claim 12, wherein the step of stacking the memory chips in each pair inside the cavity comprises:
   disposing a first memory chip inside the cavity;
   electrically connecting the first memory chip with a portion of the inner contacts;
   performing a first stage molding process to encapsulate the first memory chip and the corresponding inner contacts with a molding compound;
   stacking a second memory chip over the molding compound;
   electrically connecting the second memory chip with another portion of the inner contacts; and
   performing a second stage molding process to encapsulate the second memory chip and the corresponding inner contacts with a molding compound.

14. The method of claim 13, wherein the step of connecting the memory chips to the inner contacts comprises wire bonding.

15. The method of claim 9, wherein the molding process comprises performing a glue-dispensing process.

16. The method of claim 9, wherein the step of fabricating the ultra-thin plastic shell comprises a mold injection process including the following steps:
   providing a mold and a vacuum pump, wherein the mold has a mold cavity linked to the vacuum pump; and
   performing a mold injection process to inject molding compound into the cavity through a mold injection mechanism while the vacuum pump continuously sucks air from the cavity.

* * * * *